(12) United States Patent
Schmidt

(10) Patent No.: US 8,618,576 B1
(45) Date of Patent: Dec. 31, 2013

(54) SEMICONDUCTOR DEVICE WITH BACK SIDE METAL STRUCTURE

(75) Inventor: Gerhard Schmidt, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/595,169

(22) Filed: Aug. 27, 2012

(51) Int. Cl.
*H01L 29/08* (2006.01)
*H01L 29/49* (2006.01)
*H01L 29/749* (2006.01)

(52) U.S. Cl.
USPC ............. 257/144; 257/E29.216; 257/E27.024

(58) Field of Classification Search
None
See application file for complete search history.

(56) References Cited

U.S. PATENT DOCUMENTS

| | | | | |
|---|---|---|---|---|
| 4,857,983 | A * | 8/1989 | Baliga et al. ................. | 257/123 |
| 4,990,975 | A * | 2/1991 | Hagino ........................ | 257/142 |
| 5,659,185 | A * | 8/1997 | Iwamuro ...................... | 257/138 |
| 5,835,985 | A * | 11/1998 | Hiyoshi et al. ............... | 257/121 |
| 7,616,859 | B2 * | 11/2009 | Tokura et al. ................ | 385/147 |
| 7,952,143 | B2 * | 5/2011 | Soeno et al. ................. | 257/341 |
| 7,973,363 | B2 * | 7/2011 | Hara ............................ | 257/341 |
| 8,248,116 | B2 * | 8/2012 | Soeno et al. ................. | 327/108 |
| 8,350,289 | B2 * | 1/2013 | Tsukuda ..................... | 257/139 |
| 2003/0168718 | A1 * | 9/2003 | Matsudai et al. ............ | 257/565 |
| 2012/0007142 | A1 * | 1/2012 | Nagaoka et al. ............. | 257/140 |
| 2012/0146133 | A1 * | 6/2012 | Hirler et al. .................. | 257/330 |
| 2012/0193676 | A1 * | 8/2012 | Bobde et al. ................ | 257/140 |

FOREIGN PATENT DOCUMENTS

DE 102005061210 A1 7/2007

OTHER PUBLICATIONS

Hofmann D., "The major difference between a conventional ICGT and RB-IGBT is the reverse blocking capability" downloaded from URL <http://www.powerguru.org/the-major-difference-between-a-conventional-igbt-and-rb-igbt-is-the-reverse-blocking-capability/> on Aug. 11, 2013.*

* cited by examiner

*Primary Examiner* — Thomas L Dickey
*Assistant Examiner* — Joseph Schoenholtz
(74) *Attorney, Agent, or Firm* — Murphy, Bilak & Homiller, PLLC

(57) ABSTRACT

A semiconductor device includes a semiconductor body with a base layer and a field shaping zone of a first conductivity type. The base layer extends parallel to a back surface of the semiconductor body in a central portion and into an edge portion that surrounds the central portion. The field shaping zone is formed in the edge portion and has a maximum dopant concentration exceeding at least three times a maximum dopant concentration in the base layer. A back side metal structure directly adjoins the back surface in the central portion and extends over the edge portion. A dielectric structure is between the back side metal structure and the field shaping zone. Leakage current mechanisms reducing the reverse blocking capabilities are reduced.

25 Claims, 10 Drawing Sheets

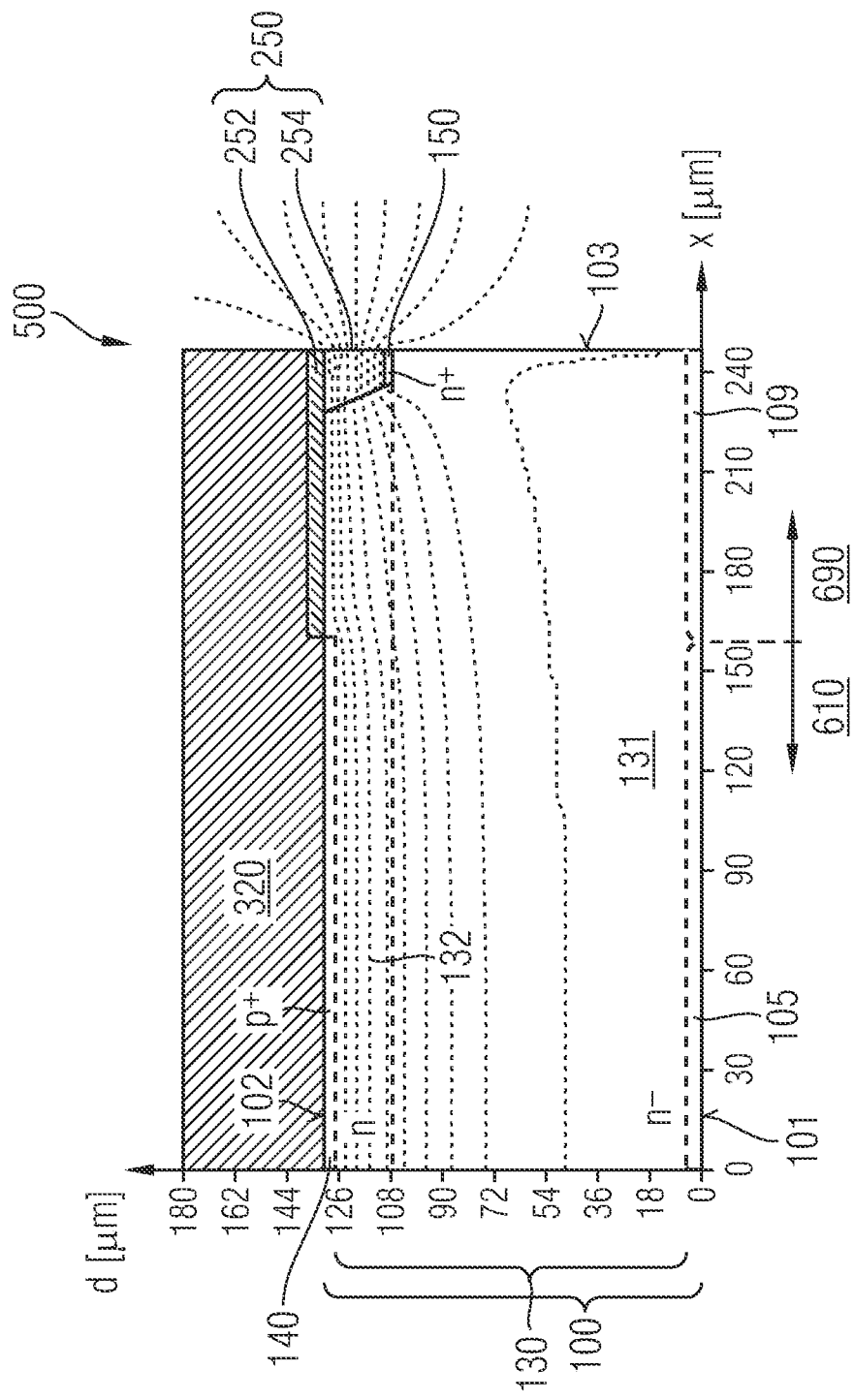

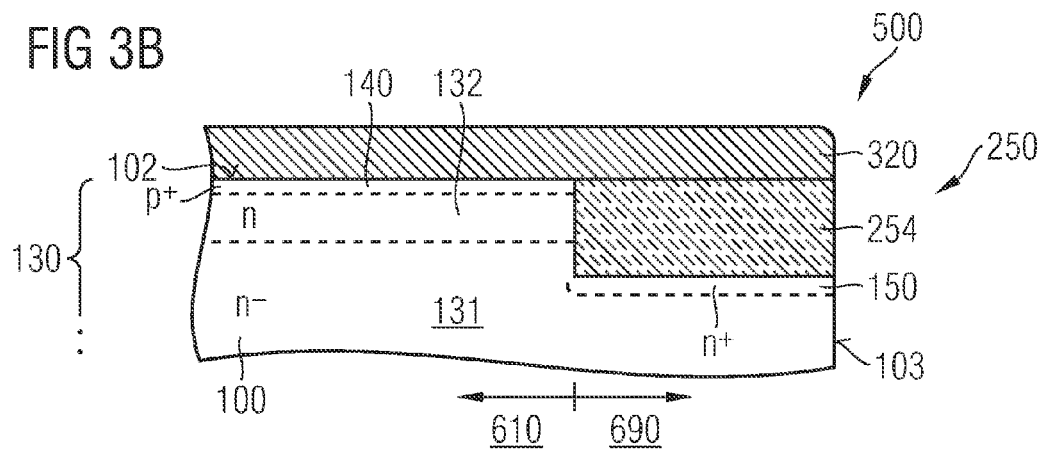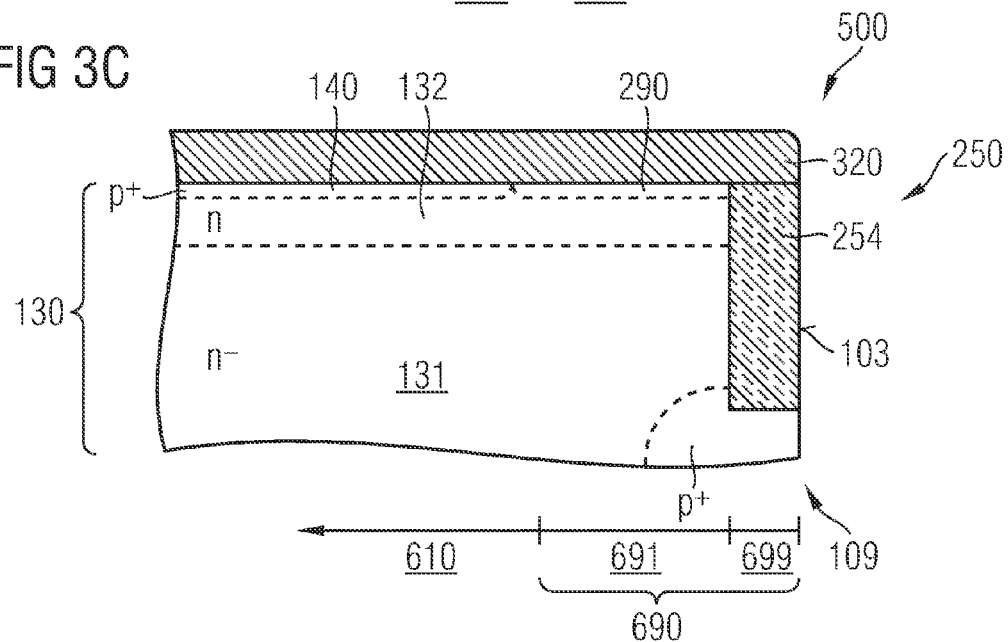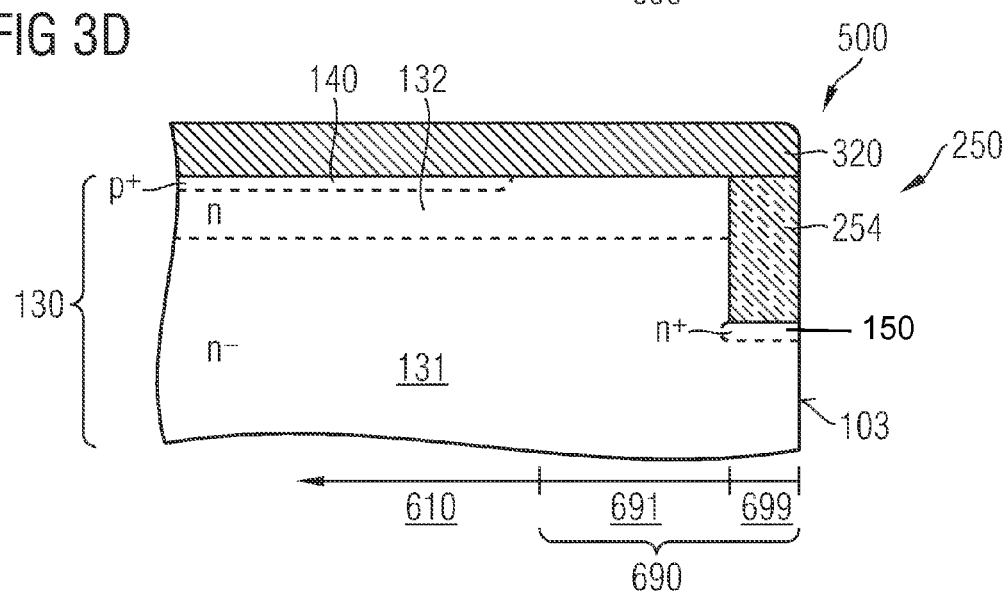

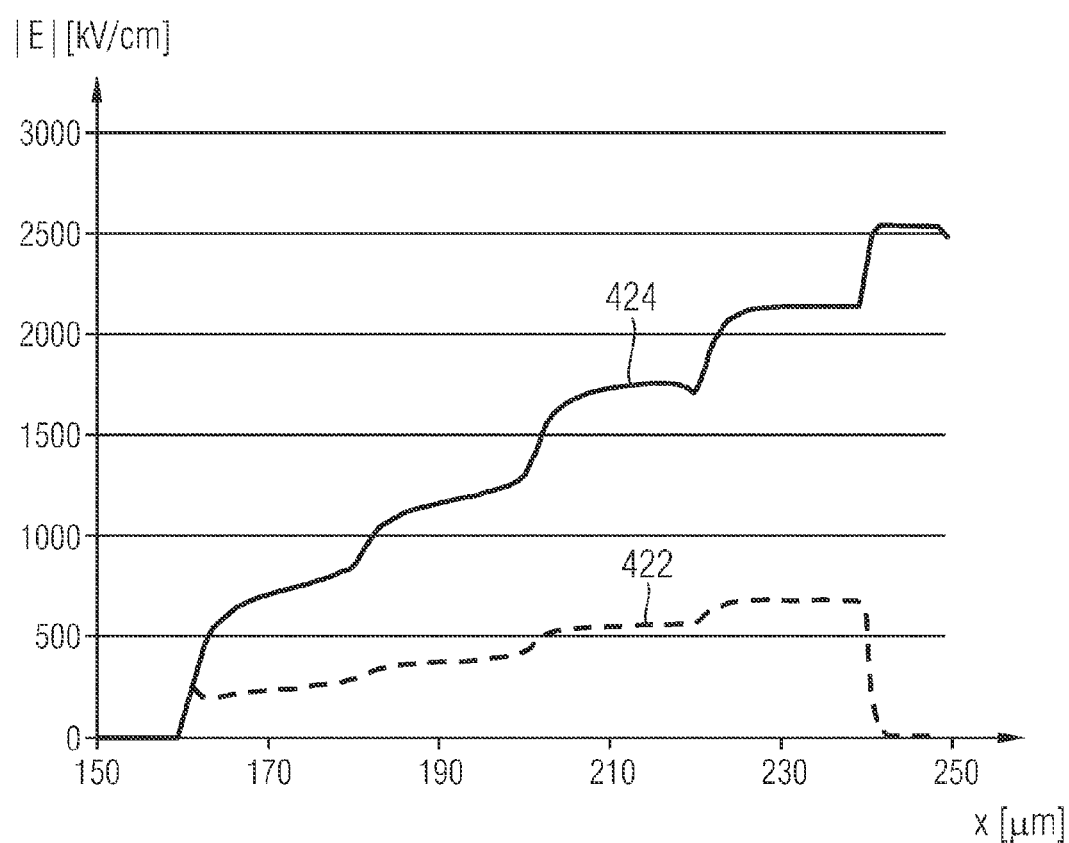

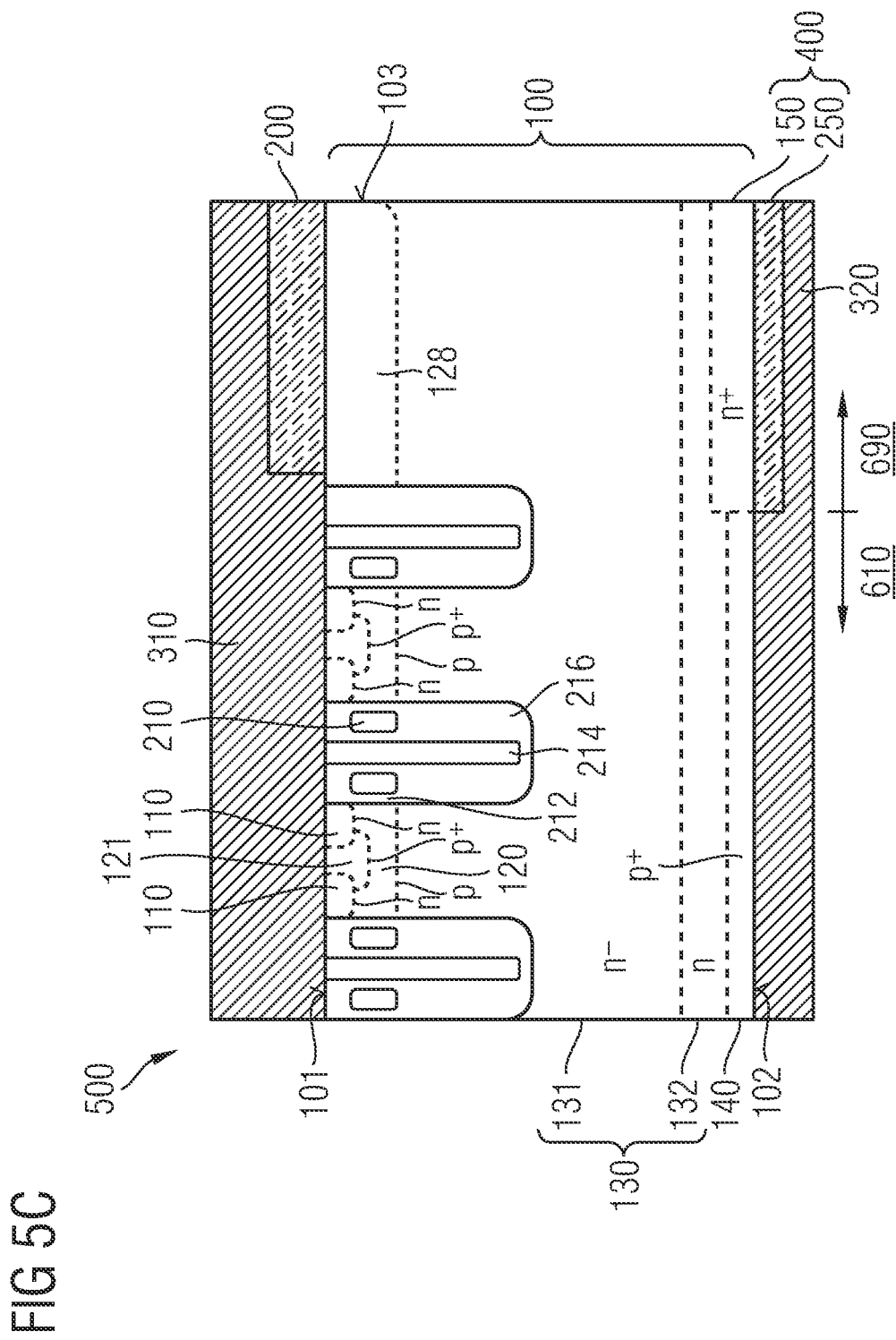

US 8,618,576 B1

SEMICONDUCTOR DEVICE WITH BACK SIDE METAL STRUCTURE

BACKGROUND

RB-IGBTs (reverse blocking insulated gate bipolar transistors) provide improved blocking characteristics in the reverse direction. For example, in a reverse blocking mode a first part of an edge construction guides a potential applied to the back side to the front side, where a second part of the edge construction relieves the electric field. It is desirable to provide semiconductor devices with enhanced reverse blocking capabilities.

SUMMARY

According to an embodiment a semiconductor device includes a semiconductor body which includes a base layer having an optional field stop layer and a field shaping zone, both of a first conductivity type. The base layer extends parallel to a back surface of the semiconductor body over a central portion and into an edge portion surrounding the central portion. The field shaping zone is formed in the edge portion and has a maximum dopant concentration that exceeds at least three times a maximum dopant concentration in the base layer. A back side metal structure directly adjoins the back surface in the central portion and extends over the edge portion. A dielectric structure is between the back side metal structure and the field shaping zone.

According to another embodiment an IGBT includes a semiconductor body which includes a base layer and a field shaping zone, both of a first conductivity type. The base layer extends parallel to a back surface of the semiconductor body over a central portion and into an edge portion surrounding the central portion. The field shaping zone is formed in the edge portion and has a maximum dopant concentration that exceeds at least three times a maximum dopant concentration in the base layer. A back side metal structure directly adjoins the back surface in the central portion and extends over the edge portion. A dielectric structure is between the back side metal structure and the field shaping zone.

According to another embodiment a semiconductor device includes a semiconductor body with a base layer of the first conductivity type. The base layer extends parallel to a back surface of the semiconductor body over a central portion and into an edge portion surrounding the central portion. A back side metal structure directly adjoins the back surface in the central portion and extends into the edge portion. A dielectric structure directly adjoins the back side metal structure and an outer surface of the semiconductor body perpendicular to the back surface. The dielectric structure extends into a well of a second conductivity type opposite to the first conductivity type. The well forms part of a front side edge termination construction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3A is a schematic cross-sectional view of a semiconductor die in accordance with an embodiment providing a dielectric structure including a narrow bulk and a plate portion.

FIG. 3B is a schematic cross-sectional view of a semiconductor die in accordance with an embodiment providing a dielectric structure including a wide bulk portion.

FIG. 3C is a schematic cross-sectional view of a semiconductor die in accordance with an embodiment providing a dielectric structure including a narrow bulk portion and a reduced emitter efficiency zone.

FIG. 3D is a schematic cross-sectional view of a semiconductor die in accordance with a further embodiment providing a narrow bulk portion.

FIG. 4C is a schematic diagram illustrating electric field distributions for illustrating effects of embodiments.

FIG. 5C is a schematic cross-sectional view of a semiconductor device in accordance with an embodiment related to an IGBT with buried gate electrodes.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
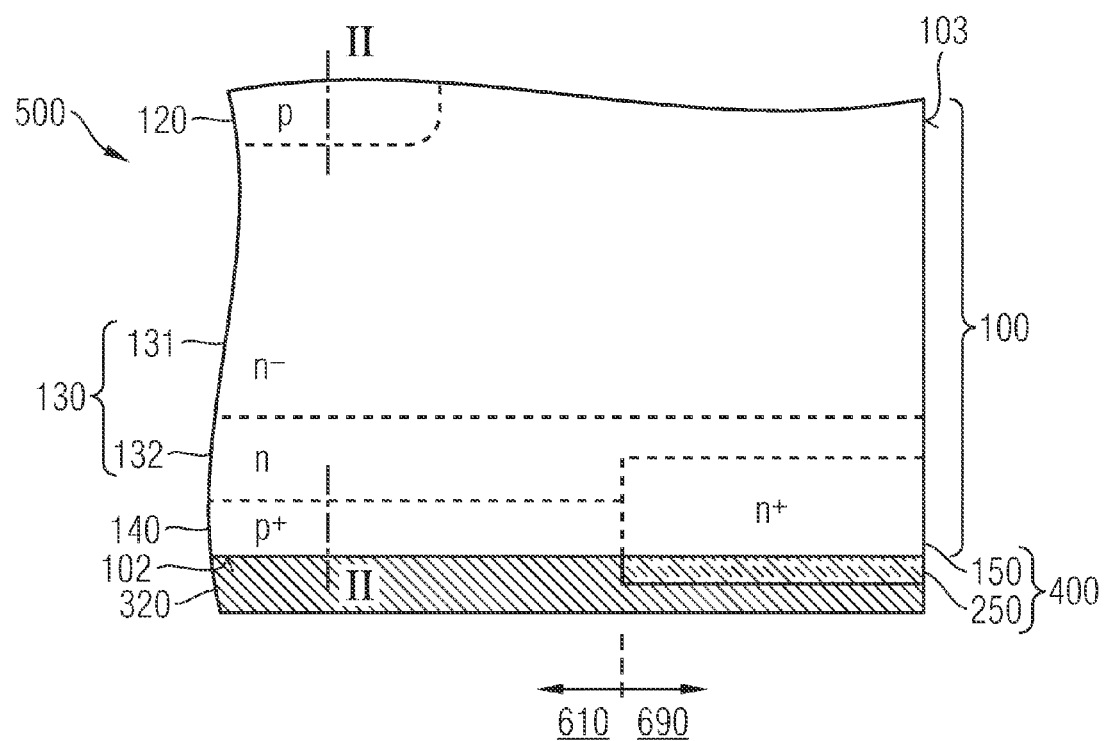
FIG. 1 is a schematic cross-sectional view of a portion of a semiconductor die in accordance with an embodiment.

FIG. 1 shows a portion of a semiconductor device 500 with at least two pn-junctions controlling a current path along which in an on-state a load current flows through the semiconductor device 500. The semiconductor device 500 may be an IGBT (insulated gate bipolar transistor) or a thyristor, for example a GTO (gate-turn-off thyristor) or a GCT (Gate commutated thyristor). The semiconductor device 500 includes a semiconductor body 100 provided from a single crystalline semiconductor material, for example silicon Si, silicon carbide SiC, germanium Ge, a silicon germanium crystal SiGe, gallium nitride GaN or gallium arsenide GaAs.

The semiconductor body 100 includes a base layer 130 of a first conductivity type. The base layer 130 extends parallel to a back surface 102 of the semiconductor body 100 over a central portion 610 and includes a drift layer 131. The dopant concentration in the drift layer 131 may be uniform or may gradually increase or decrease with decreasing distance to the back surface 102. The dopant concentration in the drift layer 131 may be between $5.0 \times 10^{13}$ and $5.0 \times 10^{14}$ cm$^{-3}$, by way of example.

The base layer 130 may or may not include a field stop layer 132 directly adjoining the drift layer 131 and arranged between the drift layer 131 and the back surface 102. The field stop layer 132 extends parallel to the back surface 102 of the semiconductor device 100. The field stop layer 132 has a uniform width within the central portion 610 and may extend into an edge portion 690, which surrounds the central portion 610 and which directly adjoins an outer surface 103 tilted to the back surface 102. According to an embodiment, the outer surface 103 of the semiconductor body 100 is perpendicular to the back surface 102.

A maximum dopant concentration in the field stop layer 132 exceeds a maximum dopant concentration in the drift layer 131 by at least three times, e.g. ten times. The drift layer 131 and the field stop layer 132 form an interface which is approximately parallel to the back surface 102. The base layer 130 forms a back side pn-junction with a collector layer 140 of the second conductivity type, which is the opposite of the first conductivity type. The collector layer 140 is exclusively formed in the central portion 610 and is absent in the edge portion 690.

The collector layer 140 may be provided by a substrate layer on which the base layer 130 is grown by epitaxy. According to an embodiment, the collector layer 140 emerges from an implant using an implant mask that covers the edge portion 690 and a tempering that anneals the implant damages. The base layer 130 forms front side pn-junctions with one or more body wells 120 extending from a front surface, which is opposite to the back surface 102, into the semiconductor body 100.

A back side metal structure 320 directly adjoins the collector layer 140 in the central portion 610. The back side metal structure 320 may provide a collector electrode of the semiconductor device 500 and may consist of or contain, as main constituent(s), aluminum Al, copper Cu or alloys of aluminum or copper, for example AlSi, AlCu, or AlSiCu. According to other embodiments, the back side metal structure 320 may contain, as main constituent(s), nickel Ni, titanium Ti, silver Ag, gold Au, platinum Pt and/or palladium Pd. For example, the back side metal structure 320 may include two or more sub-layers, each sub-layer containing one or more of Ni, Ti, Ag, Au, Pt, Pd as main constituent(s), silicides and/or alloys therefrom.

A dielectric structure 250 is sandwiched between the back side metal structure 320 and the semiconductor body 100 in the edge portion 690. The dielectric structure 250 may be or may include a plate portion having a uniform thickness. The thickness of the dielectric structure 250 may be between 0.2 micrometer and 3 micrometer, for example 1 micrometer. In the reverse blocking mode a section of the back side metal structure 320 in the edge portion 690 is effective as a field plate shaping the electric field in the semiconductor body 100 to concentrate in the dielectric structure 250.

A field shaping zone 150 is formed instead of the collector layer 140 in the edge portion 690. The field shaping zone 150 extends in a vertical direction perpendicular to the back surface 102 into the base layer 130, e.g. into the field stop zone 132. A maximum dopant concentration in the field shaping zone 150 is at least three times, for example at least ten times, the maximum dopant concentration in the field stop layer 132.

Conventional HDR (high dynamic robustness) constructions provide the collector layer 140 by an implant using an implant mask that covers the edge portion 690 and a tempering that completely activates the implanted doping atoms/ions. Then a further implant of the same conductivity type may be performed to inject doping atoms/ions of the second conductivity type into the edge portion 690. The further implant is not annealed to form a reduced emitter efficiency zone in the edge portion 690. Other embodiments may provide a reduced emitter efficiency zone by adjusting the dopant concentration accordingly in a section of the edge portion 690 directly adjoining the central portion 610. Less charge carriers, e.g. holes, are injected into the edge portion 690 whereas the transistor gain remains fully effective in the central portion 610.

On the other hand, the implant in the edge portion 690 may contribute to a leakage current in the reverse mode. The dielectric structure 250 suppresses the leakage current resulting from the implant in the edge portion 690 and hence improves the reverse blocking characteristics of the back side pn-junction in HDR devices.

Up to a specified reverse breakdown voltage, the field shaping zone 150 shapes the equipotential lines to be approximately completely concentrated within the dielectric structure 250. As a result, the outer surface 103 of the semiconductor body 100 is approximately field-free.

According to an embodiment, the field shaping zone 150 may have a uniform dopant concentration along a lateral direction parallel to the back surface 102. According to another embodiment the dopant concentration within the field shaping zone 150 may increase with decreasing distance to the outer surface 103. The dopant concentration may increase by steps. According to another embodiment, the dopant concentration increases monotonously.

Since the outer surface 103 is approximately field-free, a generation current typically induced by an electric field at a surface of a damaged semiconductor crystal as a consequence of a subsequent dicing process is reduced and further leakage current mechanisms are suppressed. As a consequence, a back side edge termination construction 400 including the dielectric structure 250 and the field shaping zone 150 at the back side of the semiconductor body 100 improves the reverse blocking capability of the semiconductor device 500.

The back side edge termination construction 400 may be combined with HDR approaches. According to an embodiment, the edge portion 690 may include an emitter efficiency reduction zone reducing the charge carrier injection from the collector layer 140 (back side emitter, cathode emitter) into the edge portion 690. Other than front side edge termination constructions providing an outer circumferential trench insulator structure for improving reverse blocking capabilities and an inner circumferential trench insulator structure for improving the forward blocking capabilities, the back side edge termination construction 400 improves area efficiency of the semiconductor device.

Figure 2A:
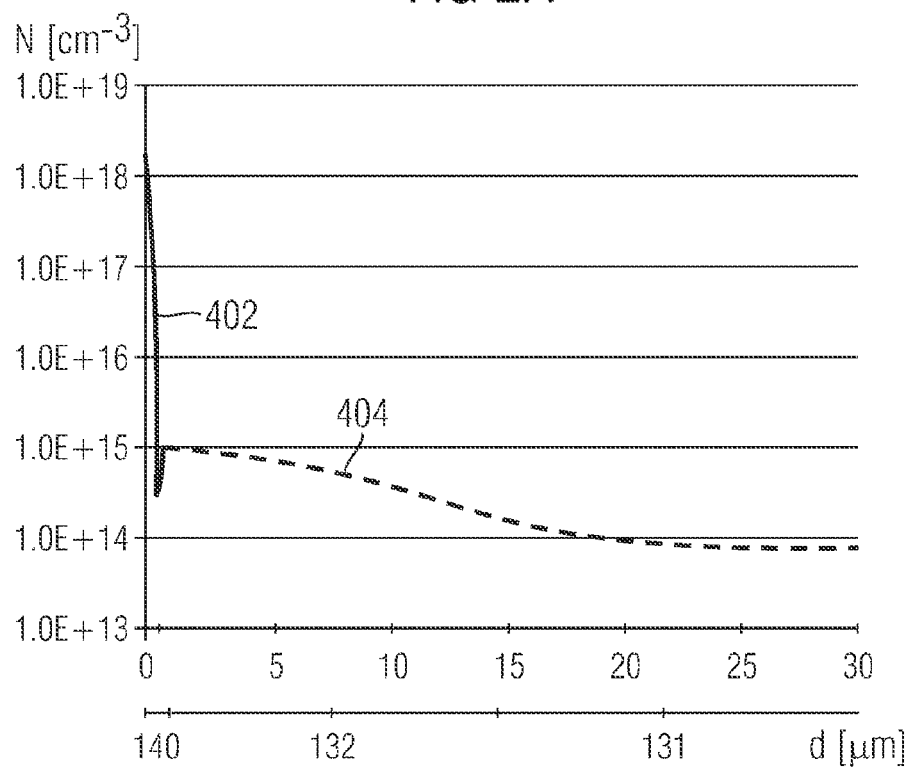
FIG. 2A is a schematic diagram showing a typical concentration distribution at the back side of a semiconductor die.

FIG. 2A shows typical dopant profiles for an IGBT with regard to a back surface 102 at d=0 of a semiconductor die along line II-II of FIG. 1. The first conductivity type is n-type and the second conductivity type is p-type. The first profile 402 gives the p-dopant concentration in the collector layer 104, which has a junction depth of about 0.6 micrometers and a maximum dopant concentration of about $1 \times 10^{18}$ cm$^{-3}$ along the back surface 102. The second profile 404 gives the n-dopant concentration in the base layer 130 including the field stop layer 132 and the drift layer 131. The field stop layer 132 has a thickness of about 15 micrometers and a maximum dopant concentration of about $9 \times 10^{14}$ cm$^{-3}$ corresponding to a dose value of about $8 \times 10^{11}$ cm$^{-2}$. The dopant concentration within the drift layer 131 is approximately $9 \times 10^{13}$ cm$^{-3}$. A depth of an IGBT cell structure may be about 5 micrometers, wherein the body wells 120 contain a dose value of about $2 \times 10^{13}$ cm$^{-2}$. Without considering edge effects, the above noted dimensions and dopant distributions would result in a forward blocking voltage of about 1830 V. The pnp amplification and effects caused by the edge termination at the front side in the edge portion 690 reduce the reverse blocking voltage by about 10 to 20 percent. For the back side oriented pn-junction, the reverse breakdown voltage would be about 1357 V in the volume.

Figure 2B:
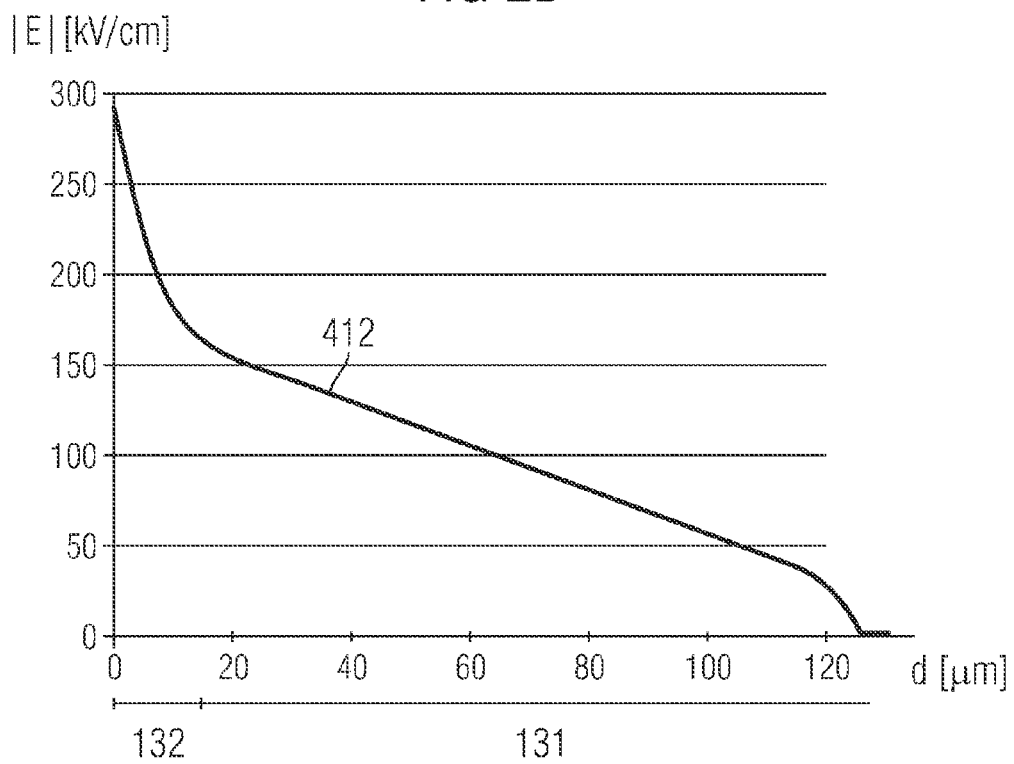
FIG. 2B is a schematic diagram showing an electric field distribution according to the concentration distribution of FIG. 2A.

FIG. 2B illustrates the electric field distribution 412 for the example of FIG. 2A at a reverse voltage of 1357 V applied at the back side pn-junction. The electric field steeply decreases close to the back surface 102 within the field stop layer 132, but the depletion zone basically may extend up to the body well 120. Similar as in the forward blocking mode, the actual breakdown voltage is lower, since holes are injected into the semiconductor body 100 as soon as the depletion zone extends up to the body wells 120. Without an additional field stop layer between the drift layer 131 and the body wells 120 a punch-through fixes the reverse breakdown capability at about 1050 V. Hence IGBTs, e.g. field stop IGBTs, intrinsically have a high reverse breakdown capability which may be exploited by appropriate edge termination constructions at the back side oriented pn-junction.

FIGS. 3A to 3D show embodiments related to dielectric structures 250 including a bulk portion provided in a trench etched from the back surface 102 into the semiconductor body 100.

FIG. 3A shows a base layer 130 that may include a drift layer 131 which is in contact with body wells of control structures 105 formed along a front side 101 in a central portion 610 of the semiconductor body 100. The base layer 130 may or may not include a field stop layer 132 between the back surface 102 and the drift layer 131, wherein the drift layer 131 and the field stop layer 132 may form an interface approximately parallel to the back surface 102. The maximum dopant concentration in the field stop layer 132 is at least three times the maximum dopant concentration in the drift layer 131, wherein the dopant concentration in the drift layer 131 may be homogenous and the dopant concentration in the field stop layer 132 may decrease with increasing distance to the back surface 102. A collector layer 140 is provided in contact with the base layer 130. A front side edge termination construction 109 may be provided in a front side edge portion, which may approximately correspond to the edge portion 690. The front side edge termination construction 109 may include a field plate construction, floating guard rings, or junction termination extensions with or without variation of lateral doping. A back side metal structure 320 is in direct contact with the collector layer 140 at least in the central portion 610.

According to the embodiment shown in FIG. 3A, the dielectric structure 250 includes both a plate portion 252 and a bulk portion 254. The plate portion 252 is in direct contact with the back surface 102 of the semiconductor body 100. The plate portion 252 may be a thermal semiconductor oxide. In addition or alternatively, the plate portion 252 may include one or more sub-layers of deposited insulator material, for example silicon oxide based on TEOS (tetraethylorthosilane) as a precursor material, BSG (boron silicate glass), PSG (phosphorus silicate glass) or BPSG (boron phosphorus silicate glass), silicon oxynitride or silicon nitride. The plate portion 252 may extend from an edge of the collector layer 140 up to the outer surface 103 of the semiconductor body 100 or to an inner edge of the bulk portion 254.

The bulk portion 254 extends from the back surface 102 into the base layer 130 along the outer surface 103. A buried edge of the bulk portion 254 may be closer to the back surface 102 than the interface between the field stop layer 132 and the drift layer 131. According to an embodiment, the bulk portion 254 may extend into the drift layer 131 or into wells of the second conductivity type forming a portion of the front side edge termination construction 109. A field shaping zone 150 of the first conductivity type extends along the buried edge of the bulk portion 254 and directly adjoins the outer surface 103.

The bulk portion 254 may be provided from one or more sub-layers of thermal or deposited insulator materials, for example silicon oxide, silicon oxynitride, silicon nitride, BSG, PSG, BPSG or dielectric polymers like benzocyclobutene, polynorbornene, polystyrene, polycarbonate, or parylene without any additives or containing one or more additives. The depth of the bulk portion 254 with respect to the back surface 102 may be 5 to 50 micrometers, for example about 20 micrometers. The width of the bulk portion 254 with respect to the outer surface 103 may be between 5 and 50 micrometers, for example about 10 micrometers.

For example, for a bulk portion having a depth of 20 micrometers and a width of 10 micrometers, a reverse breakdown voltage of 477 V results. Voltage breakthrough takes place along the corner to the field shaping zone 150. The field shaping zone 150 ensures that the potential lines exit only in a portion of the outer surface 103 where the bulk portion 254 directly adjoins the outer surface 103. By applying gentle plasma etch regimes, finishing procedures and suitable passivation layers for the bulk portion 254, a surface generation center density along the surface of the bulk portion 254 and, as a result, leakage current can be significantly reduced. According to an embodiment, an inner surface of the bulk portion 254 is perpendicular to the back surface 102. According to the illustrated embodiment, the trench for the bulk portion 254 is etched using KOH (potassium hydroxide) or TMAH (tetramethylammonium hydroxide) resulting in tilted sidewalls. A slope between the back surface 102 and the inner sidewall of the bulk portion 254 may be between at least 25 and at most 65 degrees.

According to the embodiment of FIG. 3B, the bulk portion 254 of the dielectric structure 250 extends through the field stop layer 132 into the drift layer 131 and approximately completely fills the edge portion 690 between the central portion 610 with the collector layer 140 and the outer surface 103.

FIG. 3C shows an embodiment with the bulk portion 254 extending through the drift layer 131 into a well of the second conductivity type of the front side edge termination construction 109. The bulk portion 254 is provided only in an outer portion 699 of the edge portion 690 directly adjoining the outer surface 103 of the semiconductor body 100. An inner portion 691 of the edge portion 690 between the outer portion 699 and the central portion 610 may be provided with a plate portion as depicted in FIG. 3A. According to another embodiment the collector layer 140 may extend into the inner portion 691. According to a further embodiment an implant of the second conductivity type is not annealed in the edge portion 690 to form a reduced emitter efficiency zone 290 locally reducing the charge carrier injection.

The embodiment illustrated in FIG. 3D differs from the embodiment of FIG. 3C in that the bulk portion 254 ends within the drift layer 131, a field shaping zone 150 adjoins the bulk portion 254, and the reduced emitter efficiency zone 290 is absent such that a Schottky contact is formed in the inner portion 691 of the edge portion 690.

Figure 4A:
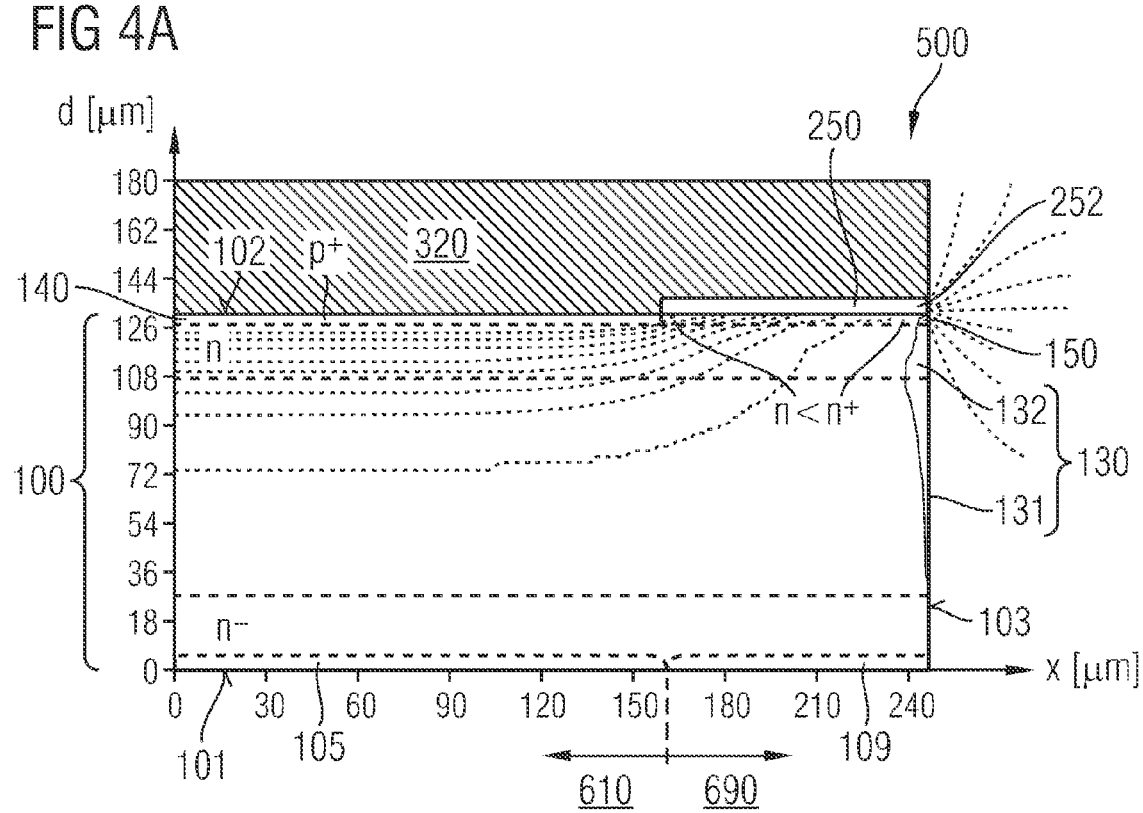
FIG. 4A is a schematic cross-sectional view of a semiconductor die in accordance with an embodiment providing a field shaping zone with a horizontal dopant gradient.
Figure 4B:
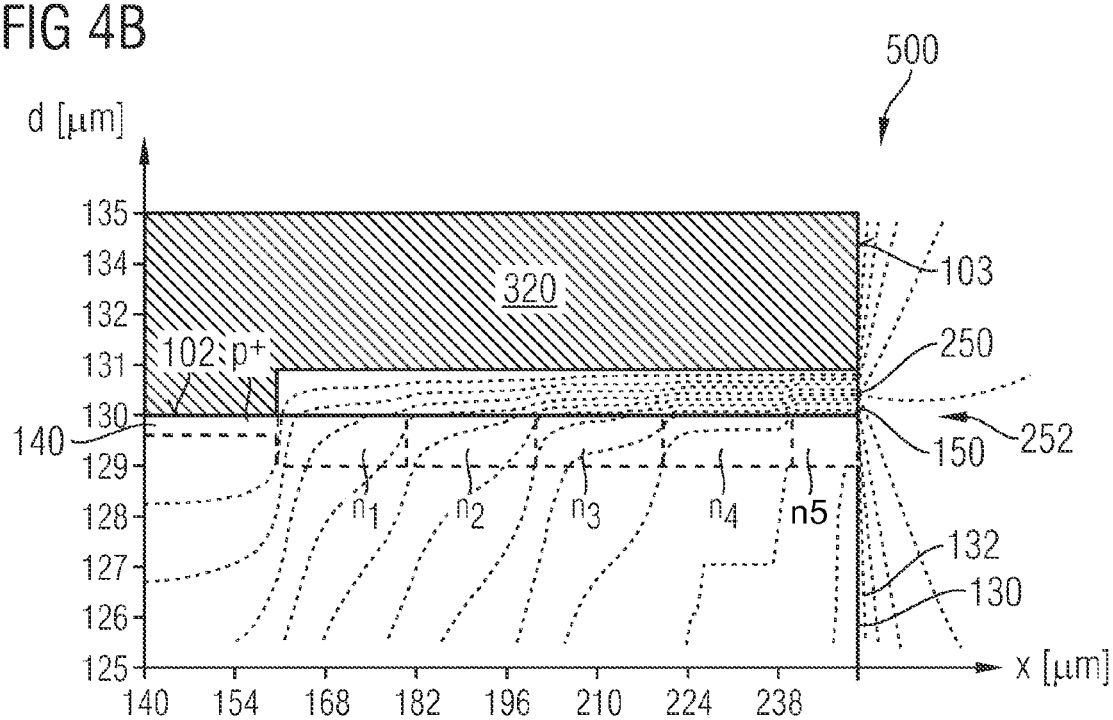
FIG. 4B shows a portion of the semiconductor substrate of FIG. 4A in more detail.

FIGS. 4A to 4B refer to an embodiment providing a field shaping zone 150 with a lateral doping variation. In the edge portion 690, the field shaping zone 150 extends from the back surface 102 into the base layer 130 wherein the base layer 130 includes a uniformly doped drift layer 131 and a field stop layer 132 between the back surface 102 and the drift layer 131. A maximum dopant concentration in the field stop layer 132 is greater than the dopant concentration in the drift layer 131. The dopant concentration in the field stop layer 132 may monotonously decrease with increasing distance to the back surface 102. In a central portion 610 of the semiconductor body 100 a collector layer 140 of the second conductivity type is formed between the back surface 102 and the base layer 130. A back side metal structure 320 directly adjoins the back surface 102 and the collector layer 140 in the central portion 610 and extends into the edge portion 690, for example up to a line closing with an outer surface 103 of the semiconductor body 100. In the edge portion 690 a dielectric structure 250 with a plate portion 252 is sandwiched between the back side metal structure 320 and the semiconductor body 100. Between the dielectric structure 250 and the base layer 130 the field shaping zone 150 is formed which dopant concentration monotonously increases with decreasing distance to the outer surface 103.

According to an embodiment the dopant concentration increases in steps. According to another embodiment, the dopant concentration increases continuously. The dopant concentration distribution in the field shaping zone 150 in a lateral direction parallel to the back surface 102 may increase in a monotonic or strictly monotonic manner. The lateral doping variation increases the maximum breakthrough voltage in the reverse direction.

FIG. 4B shows the field shaping zone 150 of FIG. 4A in more detail. According to the illustrated embodiment, the dopant concentration increases in steps from a first concentration n1 in a first section directly adjoining the collector layer 140 and resulting from an area dose of $5 \times 10^{11}$ cm$^{-2}$. An area dose in a second section n2 adjoining the first section n1 in a lateral direction parallel to the back surface 102 is $1.5 \times 10^{12}$ cm$^{-2}$, the area dose in a third section n3 adjoining the second section n2 is $3 \times 10^{12}$ cm$^{-2}$, the area dose in a fourth section n4 adjoining the third section n3 is $4.3 \times 10^{12}$ cm$^{-2}$ and the area dose in a fifth section n5 directly adjoining the fourth section n4 and the outer surface 103 is about $1 \times 10^{15}$ cm$^{-2}$. The plate portion 252 of the dielectric structure 250 has a thickness of about one micrometer. With these values for the dielectric layer 250 and the field shaping zone 150, a reverse breakdown voltage of 252 V fully applies over the dielectric structure 250. As a result the outer surface 103 of the semiconductor body 100 is field-free and the leakage current in the edge portion 690 is minimized.

Further increasing the thickness of the dielectric structure 250 of FIG. 4B may increase further the reverse voltage breakthrough capability. The field plate effect, however, is reduced such that bowing of the equipotential lines at the outer edge of the collector layer 140 dominates the breakthrough mechanism. Other embodiments may provide a softly decreasing dopant concentration of the collector layer 140 in the lateral direction. According to another embodiment, the cathode layer 140 is provided with a JTE (junction termination extension) with a lower dopant concentration or a gradually decreasing dopant concentration in the lateral direction.

In FIG. 4C a first curve 422 shows the absolute value of the electric field strength in the field shaping zone 150 and a second curve 424 shows the corresponding field distribution in the dielectric structure 250.

Figure 5A:
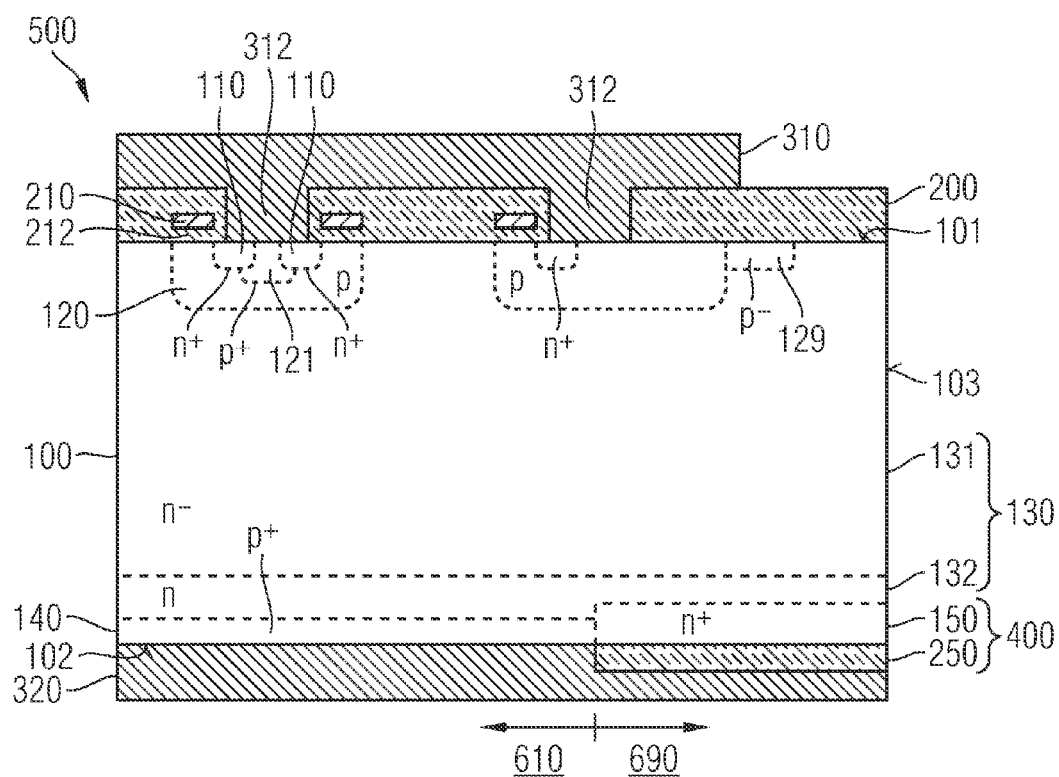
FIG. 5A is a schematic cross-sectional view of the edge portion of a semiconductor die in accordance with an embodiment related to an IGBT.
Figure 5B:
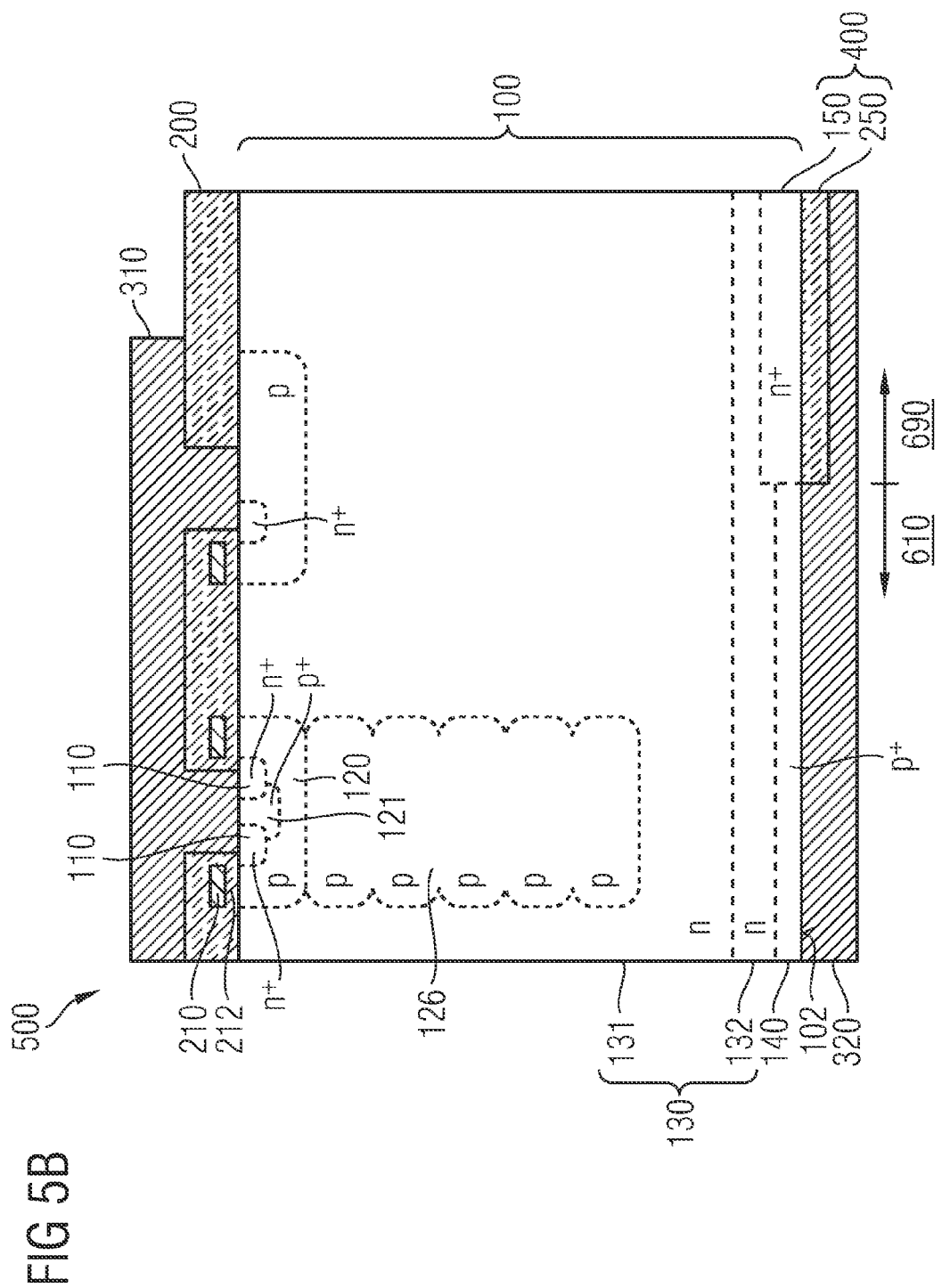
FIG. 5B is a schematic cross-sectional view of a semiconductor die in accordance with an embodiment related to a super junction IGBT.

FIGS. 5A to 5C refer to semiconductor devices 500 based on a back side edge termination construction. Each of the illustrated embodiments of FIGS. 5A to 5C includes a back side edge termination construction 400 based on a dielectric structure 250 including a plate portion 252 and a field shaping zone 150 without lateral dopant variation. The back side edge termination construction 400 can be replaced with any of the edge termination constructions as illustrated in FIG. 3A to 3C and 4A to 4B, including the modifications described in the corresponding description of the Figures.

The semiconductor devices 500 are "vertical" devices with a main current flow between a front side metal structure 310 and a back side metal structure 320 through a semiconductor body 100 in a vertical direction with respect to the interfaces to the semiconductor body 100.

FIG. 5A shows an npnp IGBT including a semiconductor body 100 with a p-type collector layer 140. An n-type base layer 130 includes a drift layer 131 and a field stop layer 132. The drift layer 131 may have an approximately uniform dopant concentration. The field stop layer 132 is formed between the drift layer 131 and the collector layer 140. A maximum dopant concentration in the field stop layer 132 is higher than the dopant concentration in the drift layer 131. The interface between the field stop layer 132 and the collector layer 140, and the interface between the drift layer 131 and the field stop layer 132 are approximately parallel to the back surface 102 of the semiconductor body 100.

P-type body wells 120 are formed by a diffusion or implant process and extend from the front surface 101 into the drift layer 131. N+-doped source zones 110 extend from the front surface 101 into the body wells 120. P-type body contact zones 121 may extend between neighboring n-doped source zones 110. The highly doped body contact zones 121 have the same conductivity type as the body wells 120, adjoin the front surface 101, and provide a low-ohmic connection from the front surface 101 to the body wells 120. Gate electrodes 210 formed from one or more conductive materials, for example highly doped polycrystalline silicon, metals, metal compounds or metal alloys are disposed outside the semiconductor body 100 at a distance to the front surface 101. Gate dielectrics 212 separate the gate electrodes 210 from the semiconductor body 100 and the body wells 120. According to other embodiments, the gate electrodes 210 may be arranged in trenches extending from the front surface 101 into the semiconductor body 100.

In an off-state of the IGBT 500, the pn-junctions of the body wells 120 inhibit a current flow between the source zones 110 and the base layer 130. In an on-state, a positive potential applied to the gate electrodes 210 controls the charge carrier distribution in a channel portion of the body wells 120 along the gate dielectrics 212 to form a conductive channel of charge carriers between the source zones 110 and the base layer 130. The current through the body wells 120 controls a current of the pnp transistor formed between the body wells 120 and the collector layer 140.

An insulator structure 200 is formed in direct contact with the front surface 101. The insulator structure 200 may include one or more sub-layers, for example an adhesion layer, a buffer layer and/or a diffusion barrier layer. According to an embodiment, the insulator structure 200 includes a thermally grown semiconductor oxide layer formed contemporaneously with the gate dielectric 212. The insulator structure 200 may include a diffusion barrier layer, for example a silicon nitride or silicon oxynitride layer. A thin silicon oxide layer provided from deposited oxide, for example using TEOS as precursor material, or a silicate glass, for example undoped silicate glass, may form an adhesive or buffer layer. A main dielectric layer may be provided from BSG, PSG or BPSG. Other embodiments may provide less or more sub-layers. A front side metal structure 310, which the insulator structure 200 electrically separates from the gate electrodes 210 and the base layer 130, may provide an emitter electrode connected to the n-doped source zones 110 and the body contact zones 121 through openings in the insulator structure 200.

A back side metal structure 320 is in direct contact with the back surface 102. Each of the front side and back side metal structures 310, 320 may consist of or contain, as main constituent(s) aluminum Al, copper Cu, or alloys of aluminum or copper, for example AlSi, AlCu or AlSiCu. According to other embodiments, one or both of the front side and back side metal structures 310, 320 may contain, as main constituent(s), nickel Ni, titanium Ti, silver Ag, gold Au, platinum Pt and/or palladium Pd. For example, at least one of the front side and back side metal structures 310, 320 includes two or more sub-layers, each sub-layer containing one or more of Ni, Ti, Ag, Au, Pt, and Pd as main constituent(s), e.g. silicides and/or alloys therefrom. Contact plugs 312 electrically connect the front side metal structure 310 with the source zones 110 and the body contact zones 121. The contact plugs 312 may include metal silicides, for example a titanium silicide TiSi, tantalum silicide TaSi or tungsten silicide WSi, by way of example, wherein the metal silicide is formed along the interface between the contact plugs 312 and the semiconductor body 100. According to the illustrated embodiment, the contact plugs 312 rest on the front surface 101. Other embodiments may provide contact trenches extending from the front surface 101 into the semiconductor body 100, wherein the metal silicides line the bottom and the sidewalls of the contact trenches. While the body wells 120 and source zones 110 are completely formed in the central portion 610, one or more of the structures may be absent in a front side edge portion which approximately corresponds to the edge portion 690. Instead, a lateral junction termination extension 129 may be formed below the insulator structure 200 in the semiconductor body 100, wherein the front side metal structure 310 is effective as a field plate modulating the electric field distribution in the front side edge portion.

The IGBT 500 further includes a back side edge termination construction 400 according to any of the embodiments of FIGS. 3A to 3C and 4A to 4B. According to the illustrated embodiment, the edge termination construction 400 at the back side 102 includes a dielectric structure 250 with a plate portion sandwiched between the semiconductor body 100 and the back side metal structure 320 in the edge portion 690 and a field shaping zone 150 extending, in the edge portion 690, from the back surface 102 into the semiconductor body 100. The back side edge termination construction 400 reduces a leakage current generated, for example, by not-annealed implant damages in the edge region 690 and, by concentrating the electric field in the dielectric structure 250 in the reverse bias mode, minimizing leakage current mechanisms induced along the outer surface 103 in the presence of an electrical field.

The semiconductor device 500 of FIG. 5B is an IGBT with a super junction architecture. Columns 126 of the conductivity type of the body wells 120 extend in a vertical direction perpendicular to the back surface 102 below the body wells 120. The columns 126 are structurally and electrically connected with the body wells 120. Each column 126 includes one or more implant zones adjoining to each other in a vertical direction. Outside the p-type columns 126, the drift layer 131 forms n-type columns separating the p-type columns 126.

FIG. 5C refers to an embodiment with the gate electrodes 210 formed in gate trenches extending from the front surface 101 into the semiconductor body 100. The gate trenches may also include field electrodes 214, which potential may float. Other embodiments electrically couple the field electrodes 214 to the emitter electrode or to an output terminal of a driver circuit, by way of example.

Figure 6:
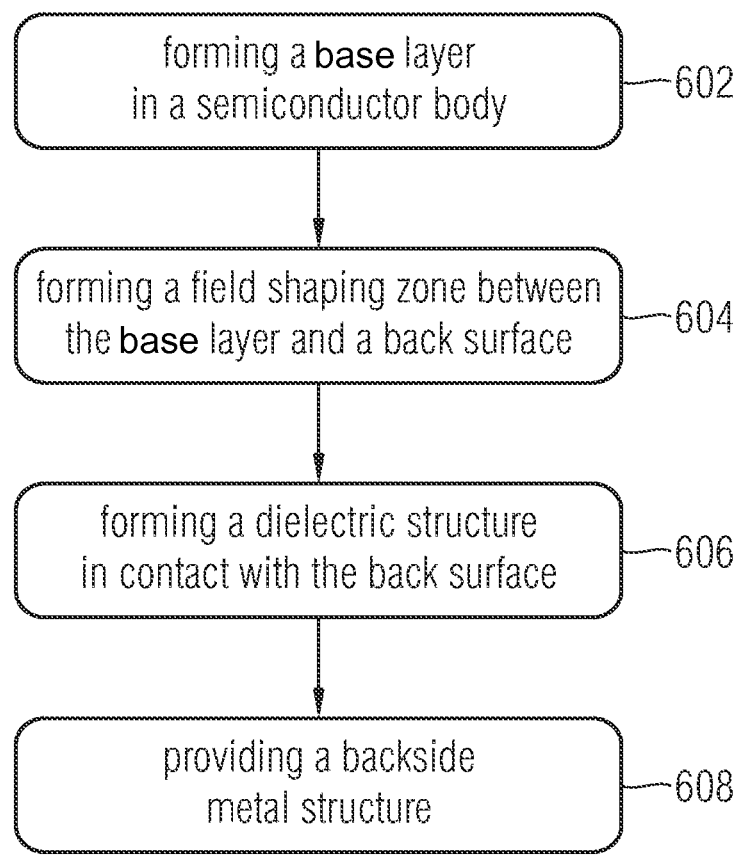
FIG. 6 is a simplified flowchart of a method of manufacturing a semiconductor device in accordance with a further embodiment.

FIG. 6 illustrates an embodiment related to the manufacturing of a semiconductor device. A base layer of a first conductivity type is formed in a semiconductor body, wherein the base layer extends parallel to a back surface of the semiconductor body over a central portion and into an edge portion surrounding the central portion (602). A field shaping zone of the first conductivity type is formed in the edge portion, wherein a maximum dopant concentration in the field shaping zone exceeds at least three times a dopant concentration in the base layer (604). A dielectric structure is provided that directly adjoins the back surface in the edge portion (606). A back side metal structure is provided that directly adjoins the back surface in the central portion and the dielectric structure in the edge portion (608).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body that comprises a base layer and a field shaping zone of a first conductivity type, the base layer extending parallel to a back surface of the semiconductor body over a central portion and into an edge portion surrounding the central portion, the field shaping zone formed in the edge portion and having a maximum dopant concentration exceeding at least three times a maximum dopant concentration in the base layer;
   a back side metal structure directly adjoining the back surface in the central portion and extending into the edge portion; and
   a dielectric structure between the back side metal structure and the field shaping zone.

2. The semiconductor device of claim 1, wherein the base layer comprises a drift layer and a field stop layer between the drift layer and the back surface, the field stop layer having a uniform width in the central portion.

3. The semiconductor device of claim 1, wherein the dielectric structure directly adjoins an outer surface of the semiconductor body perpendicular to the back surface.

4. The semiconductor device of claim 1, wherein the field shaping zone directly adjoins an outer surface of the semiconductor body perpendicular to the back surface.

5. The semiconductor device of claim 1, wherein the dielectric structure includes a plate portion directly adjoining the central portion.

6. The semiconductor device of claim 5, wherein the plate portion directly adjoins an outer surface of the semiconductor body perpendicular to the back surface.

7. The semiconductor device of claim 1, wherein a doping concentration in the field shaping zone increases with increasing distance to the central portion.

8. The semiconductor device of claim 1, wherein the dielectric structure includes a bulk portion directly adjoining an outer surface of the semiconductor body perpendicular to the back surface.

9. The semiconductor device of claim 8, wherein the bulk portion extends into the field stop layer.

10. The semiconductor device of claim 8, wherein the dielectric structure comprises a plate portion between the central portion and the bulk portion.

11. The semiconductor device of claim 8, wherein a sidewall of the bulk portion oriented to the central portion has a slope of at least 25 and at most 65 degrees with regard to the back surface.

12. The semiconductor device of claim 1, further comprising a collector layer of a second conductivity type, which is the opposite of the first conductivity type, the collector layer arranged between the back side metal structure and the field stop layer in the central portion.

13. The semiconductor device of claim 1, further comprising a reduced emitter efficiency zone in the edge portion of the semiconductor body.

14. The semiconductor device of claim 1, wherein a dopant profile of the field shaping zone and a thickness and shape of the dielectric structure are adjusted such that at an electric field is concentrated in a portion of the outer surface where the dielectric structure and the field shaping zone are in direct contact with the outer surface.

15. The semiconductor device of claim 1, wherein a maximum dopant concentration of the field stop layer exceeds at least twice the maximum dopant concentration in the drift zone.

16. The semiconductor device of claim 1, further comprising source zones of the first conductivity type in the central portion between the base layer and a front surface opposite to the back surface.

17. The semiconductor device of claim 16, further comprising a front side metal structure electrically connected to the source zone.

18. The semiconductor device of claim 17, further comprising body wells of the second conductivity type provided in the base layer and embedding the source zones.

19. The semiconductor device of claim 16, wherein the semiconductor device is arranged to supply, in an on-state or forward mode, a current flowing between the front side and back side metal structures.

20. The semiconductor device of claim 16, further comprising a front side edge termination construction formed along the front surface in a front side edge portion.

21. An insulated gate bipolar transistor, comprising:
   a semiconductor body that comprises a base layer and a field shaping zone of a first conductivity type, the base layer extending parallel to a back surface of the semiconductor body over a central portion and into an edge portion surrounding the central portion, the field shaping zone formed in the edge portion and having a maximum dopant concentration exceeding at least three times a maximum dopant concentration in the base layer;
   a back side metal structure directly adjoining the back surface in the central portion and extending into the edge portion; and
   a dielectric structure between the back side metal structure and the field shaping zone.

22. The insulated gate bipolar transistor of claim 21, wherein the base layer comprises a drift layer and a field stop layer between the drift layer and the back surface, the field stop layer having a uniform width in the central portion.

23. The insulated gate bipolar transistor of claim 21, further comprising a collector layer of a second conductivity type which is the opposite of the first conductivity type, the collector layer arranged in the central portion between the back side metal structure and the field stop layer.

24. A method of manufacturing a semiconductor device, the method comprising:
   forming a base layer of a first conductivity type in a semiconductor body, the base layer extending parallel to a back surface of the semiconductor body over a central portion and into an edge portion surrounding the central portion;
   forming a field shaping zone of the first conductivity type in the edge portion, wherein a maximum dopant concentration in the field shaping zone exceeds at least three times a dopant concentration in the base layer;
   providing a dielectric structure directly adjoining the back surface in the edge portion; and
   providing a back side metal structure directly adjoining the back surface in the central portion and the dielectric structure in the edge portion.

25. A semiconductor device, comprising:
   a semiconductor body that comprises a base layer of a first conductivity type, the base layer extending parallel to a back surface of the semiconductor body over a central portion and into an edge portion surrounding the central portion;

a back side metal structure directly adjoining the back surface in the central portion and extending into the edge portion; and a dielectric structure directly adjoining the back side metal structure, directly adjoining an outer surface of the semiconductor body perpendicular to the back surface, and extending into a well of a second conductivity type opposite to the first conductivity type, the well forming part of a front side edge termination construction.

\* \* \* \* \*